(12) United States Patent
Shindo et al.

(10) Patent No.: US 12,354,846 B2
(45) Date of Patent: Jul. 8, 2025

(54) PLASMA PROCESSING APPARATUS

(71) Applicant: Tokyo Electron Limited, Tokyo (JP)

(72) Inventors: Takahiro Shindo, Tokyo (JP); Hiroki Arai, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 240 days.

(21) Appl. No.: 17/969,603

(22) Filed: Oct. 19, 2022

(65) Prior Publication Data

US 2023/0124217 A1 Apr. 20, 2023

(30) Foreign Application Priority Data

Oct. 20, 2021 (JP) .................................. 2021-171833

(51) Int. Cl.
*H01J 37/32* (2006.01)
(52) U.S. Cl.
CPC ... *H01J 37/32577* (2013.01); *H01J 37/32211* (2013.01); *H01J 37/3244* (2013.01)
(58) Field of Classification Search
None
See application file for complete search history.

(56) References Cited

U.S. PATENT DOCUMENTS

| | | | | |
|---|---|---|---|---|
| 5,421,891 A | * | 6/1995 | Campbell | H01J 37/32688 204/298.37 |
| 5,429,070 A | * | 7/1995 | Campbell | H01J 37/3244 204/298.37 |
| 5,584,974 A | * | 12/1996 | Sellers | H01J 37/3444 204/192.12 |
| 5,895,558 A | * | 4/1999 | Spence | H01J 37/32 422/906 |
| 6,059,935 A | * | 5/2000 | Spence | H01J 37/32 422/186.05 |
| 6,416,633 B1 | * | 7/2002 | Spence | H01J 37/32825 422/186.05 |

(Continued)

FOREIGN PATENT DOCUMENTS

| | | |
|---|---|---|
| JP | 1997-053176 A | 2/1997 |
| JP | 2007-515760 A | 6/2007 |

(Continued)

*Primary Examiner* — Srinivas Sathiraju
(74) *Attorney, Agent, or Firm* — Fenwick & West LLP

(57) ABSTRACT

A plasma processing apparatus comprising: a chamber; a lower electrode provided in the chamber and included in a substrate support mounts a substrate thereon; an upper electrode provided in the chamber and disposed to face the lower electrode; a gas supply configured to supply a processing gas between the upper electrode and the lower electrode; a high-frequency power supply electrically connected to the upper electrode and configured to generate a plasma of the processing gas by applying a high-frequency voltage to the upper electrode; and a circuit portion electrically connected between the high-frequency power supply and the lower electrode and provides a potential to the lower electrode. The circuit portion provides the potential to the lower electrode by causing a current to flow from the high-frequency power supply toward the lower electrode when a potential of the high-frequency power supply is higher than a potential of the lower electrode.

12 Claims, 9 Drawing Sheets

(56) References Cited

U.S. PATENT DOCUMENTS

| | | | |
|---|---|---|---|
| 9,011,637 B2 * | 4/2015 | Yamamoto | H01J 37/32568 156/345.47 |
| 9,021,984 B2 * | 5/2015 | Yamamoto | H01J 37/32642 156/345.43 |
| 9,142,391 B2 * | 9/2015 | Yamamoto | H01J 37/32715 |
| 11,450,512 B2 * | 9/2022 | Iwashita | H01L 21/3065 |
| 11,569,070 B2 * | 1/2023 | Sekiya | H01L 21/3065 |
| 11,990,884 B2 * | 5/2024 | Crandell | H03H 19/004 |
| 2001/0014520 A1 | 8/2001 | Usui et al. | |
| 2004/0041671 A1 * | 3/2004 | Van Rumpt | H03J 5/246 334/30 |
| 2006/0244391 A1 * | 11/2006 | Shishido | G09G 3/3258 315/169.3 |
| 2007/0210721 A1 | 9/2007 | Aldea et al. | |
| 2008/0061794 A1 * | 3/2008 | Pankratz | H05H 1/46 324/536 |
| 2009/0065351 A1 * | 3/2009 | Nuss | C23C 14/3492 204/192.15 |
| 2009/0314432 A1 * | 12/2009 | Iizuka | H01J 37/32623 156/345.43 |
| 2010/0073406 A1 * | 3/2010 | Shishido | G09G 3/2033 345/691 |
| 2010/0252199 A1 * | 10/2010 | Marakhtanov | C23C 16/5096 156/345.48 |
| 2011/0287631 A1 * | 11/2011 | Yamamoto | H01J 37/32577 438/758 |
| 2014/0283746 A1 * | 9/2014 | Seo | C23C 16/513 118/723 R |
| 2014/0284754 A1 * | 9/2014 | Yamamoto | H10D 8/045 257/773 |
| 2015/0249055 A1 * | 9/2015 | Yamamoto | H10D 62/126 257/476 |
| 2016/0160351 A1 * | 6/2016 | Seo | C23C 16/509 118/723 R |
| 2016/0168706 A1 * | 6/2016 | Seo | H01J 37/32477 118/723 R |
| 2017/0213734 A9 * | 7/2017 | Marakhtanov | H01J 37/32165 |
| 2018/0012784 A1 * | 1/2018 | Eto | H01J 37/32082 |
| 2018/0025930 A1 * | 1/2018 | Augustyniak | H01L 21/68771 438/798 |
| 2019/0096731 A1 * | 3/2019 | Eto | H01J 37/32091 |
| 2020/0212869 A1 * | 7/2020 | Morii | H01J 37/32183 |
| 2021/0142982 A1 * | 5/2021 | Iwashita | H01L 21/31 |
| 2021/0343503 A1 * | 11/2021 | Torii | H01J 37/32642 |
| 2022/0020568 A1 * | 1/2022 | Shindo | H01L 21/32051 |
| 2022/0037121 A1 * | 2/2022 | Dorf | H01L 21/31116 |
| 2022/0139672 A1 * | 5/2022 | Ohshita | H01J 37/32706 216/67 |
| 2022/0399184 A1 * | 12/2022 | Cui | H01J 37/32862 |
| 2022/0399193 A1 * | 12/2022 | Cui | H01J 37/32146 |
| 2023/0038750 A1 * | 2/2023 | Shindo | H01J 37/32568 |
| 2023/0064671 A1 * | 3/2023 | Alskran | H02M 7/5387 |
| 2023/0124217 A1 * | 4/2023 | Shindo | H01J 37/3244 315/111.21 |

FOREIGN PATENT DOCUMENTS

| | | | | |
|---|---|---|---|---|
| JP | 2009-084591 A | 4/2009 | | |
| JP | 2015-124398 A | 7/2015 | | |
| JP | 2021-108413 A | 7/2021 | | |
| KR | 10-2001-0082664 A | 8/2001 | | |
| KR | 10-1594935 B1 | 2/2016 | | |
| WO | WO-0115212 A1 * | 3/2001 | | H01J 37/32082 |
| WO | WO 2005/062337 A1 | 7/2005 | | |
| WO | WO-2019073798 A1 * | 4/2019 | | C23C 16/44 |

* cited by examiner

PLASMA PROCESSING APPARATUS

CROSS-REFERENCE TO RELATED APPLICATIONS

This application claims priority to Japanese Patent Application No. 2021-171833 filed on Oct. 20, 2021, the entire contents of which are incorporated herein by reference.

TECHNICAL FIELD

An exemplary embodiment of the present disclosure relates to a plasma processing apparatus.

BACKGROUND

Plasma processing is frequently used for processing substrates such as semiconductor wafers. Japanese Laid-open Patent Publication No. 2021-108413 and Japanese Laid-open Patent Publication No. 2015-124398 disclose techniques for controlling an impedance of a current path leading to a lower electrode for high-frequency current used for plasma generation.

SUMMARY

The present disclosure provides a technique for reducing energy of ions incident toward a substrate mounted on a lower electrode.

In accordance with an aspect of the present disclosure, there is provided a plasma processing apparatus comprising: a chamber; a lower electrode provided in the chamber and included in a substrate support configured to mount a substrate thereon; an upper electrode provided in the chamber and disposed to face the lower electrode; a gas supply configured to supply a processing gas between the upper electrode and the lower electrode; a high-frequency power supply electrically connected to the upper electrode and configured to generate a plasma of the processing gas by applying a high-frequency voltage to the upper electrode; and a circuit portion electrically connected between the high-frequency power supply and the lower electrode and configured to provide a potential to the lower electrode. The circuit portion is configured to provide the potential to the lower electrode by causing a current to flow from the high-frequency power supply toward the lower electrode when a potential of the high-frequency power supply is higher than a potential of the lower electrode.

DETAILED DESCRIPTION

Figure 1:
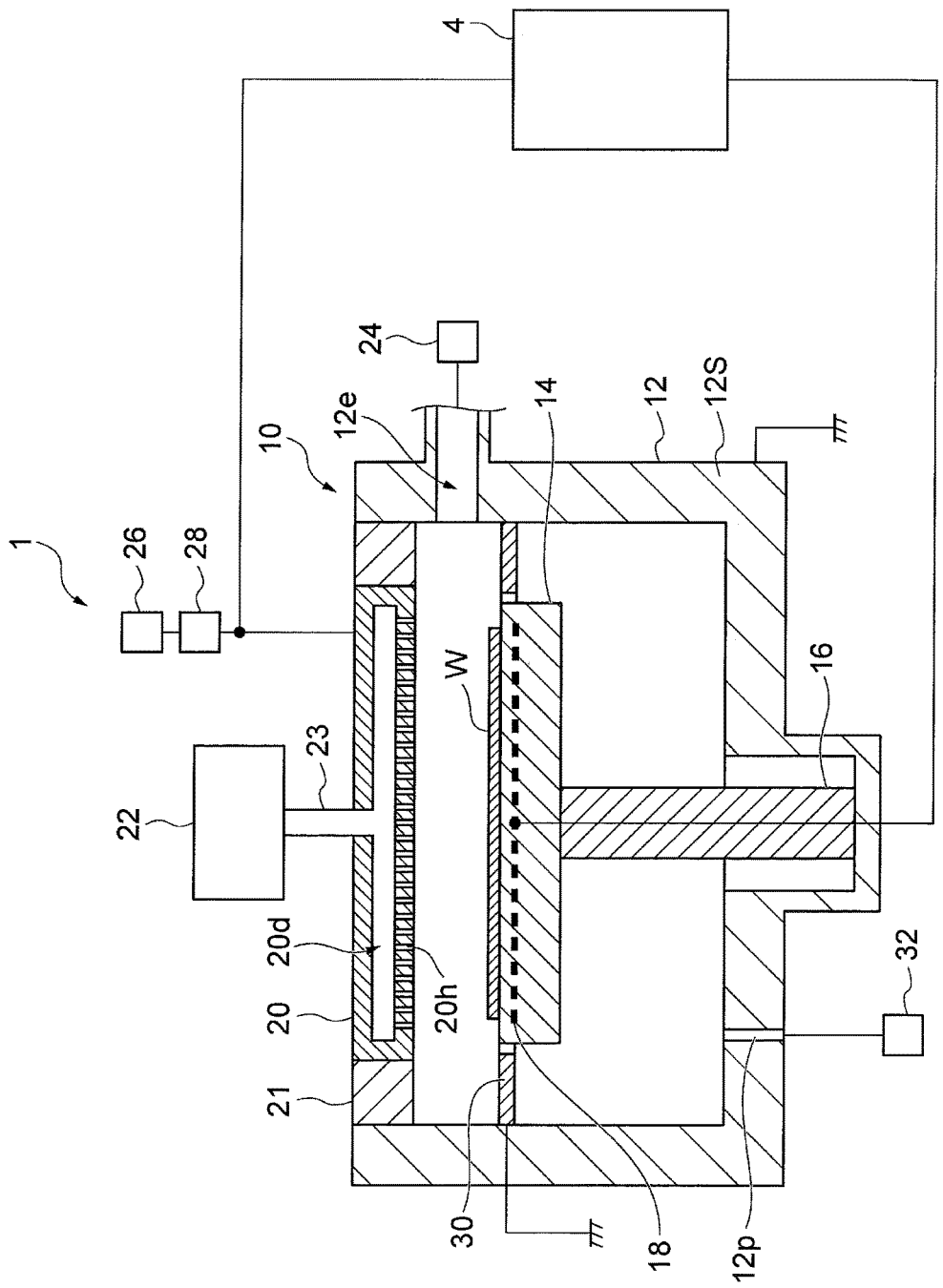
FIG. 1 is a diagram illustrating a configuration of a plasma processing apparatus according to one exemplary embodiment.

Hereinafter, various exemplary embodiments will be described.

In one exemplary embodiment, a plasma processing apparatus is provided. The plasma processing apparatus includes a chamber, a lower electrode, an upper electrode, a gas supply, a high-frequency power supply, and a circuit portion. The lower electrode is provided in the chamber and included in a substrate support configured to mount a substrate thereon. The upper electrode is provided in the chamber and disposed to face the lower electrode. The gas supply is configured to supply a processing gas between the upper electrode and the lower electrode. The high-frequency power supply is electrically connected to the upper electrode and configured to generate a plasma of the processing gas by applying a high-frequency voltage to the upper electrode. The circuit portion is electrically connected between the high-frequency power supply and the lower electrode and configured to provide a potential to the lower electrode. The circuit portion is configured to provide the potential to the lower electrode by causing a current to flow from the high-frequency power supply toward the lower electrode when a potential of the high-frequency power supply is higher than a potential of the lower electrode.

According to the plasma processing apparatus including the circuit portion, the circuit portion makes the potential of the lower electrode equal to or higher than the potential of the high-frequency power supply that provides a potential to the upper electrode. Accordingly, a sheath voltage in a sheath region formed at a boundary between the substrate mounted on the lower electrode and the plasma during plasma generation is low. This reduces energy of ions in the plasma which may collide with the substrate.

Further, when a plasma is formed in a space between an electrically grounded sidewall of the chamber and the lower electrode, power can flow from the lower electrode to ground through the sidewall. In the plasma processing apparatus including the circuit portion according to one exemplary embodiment, the potential of the lower electrode is equal to or higher than the potential of the high-frequency power supply that provides the potential to the upper electrode. Accordingly, a sheath voltage that may be generated when power flows from the lower electrode to the ground through the sidewall is approximately the same as a sheath voltage that may be generated when no power flows from the lower electrode to the ground through the sidewall. In this way, even when power flows from the lower electrode to the ground through the sidewall, it is possible to avoid an increase in the sheath voltage.

In one exemplary embodiment, the circuit portion may include a diode. An anode of the diode may be electrically connected to the high-frequency power supply. A cathode of the diode may be electrically connected to the lower electrode.

In one exemplary embodiment, the circuit portion may include a diode and a Zener diode. The diode and the Zener diode may be connected in series. An anode of the diode may be electrically connected to the high-frequency power supply. A cathode of the diode may be electrically connected to a cathode of the Zener diode. An anode of the Zener diode may be electrically connected to the lower electrode.

In one exemplary embodiment, the circuit portion may include a diode and a resistor. The diode and the resistor may be connected in series. An anode of the diode may be electrically connected to the high-frequency power supply. A cathode of the diode may be electrically connected to the lower electrode via the resistor.

In one exemplary embodiment, the circuit portion may include a diode and an inductor. The diode and the inductor may be connected in series. An anode of the diode may be electrically connected to the high-frequency power supply. A cathode of the diode may be electrically connected to the lower electrode via the inductor.

In one exemplary embodiment, the circuit portion may include a first potential measuring device, a second potential measuring device, a switching element, and a driving circuit. The switching element may be electrically connected between the high-frequency power supply and the lower electrode and configured to turn on and off electrical continuity between the high-frequency power supply and the lower electrode. The first potential measuring device may be electrically connected between the high-frequency power supply and the driving circuit, measure a potential of the high-frequency power supply to generate a first measurement result, and output the first measurement result to the driving circuit. The second potential measuring device may be electrically connected between the lower electrode and the driving circuit, measure a potential of the lower electrode to generate a second measurement result, and output the second measurement result to the driving circuit. The driving circuit may drive the switching element to turn on the electrical continuity between the high-frequency power supply and the lower electrode when the potential of the high-frequency power supply is higher than the potential of the lower electrode on the basis of the first measurement result and the second measurement result. The driving circuit may be configured to drive the switching element to turn off the electrical continuity between the high-frequency power supply and the lower electrode when the potential of the high-frequency power supply is equal to or lower than the potential of the lower electrode on the basis of the first measurement result and the second measurement result.

In one exemplary embodiment, the plasma processing apparatus may further include a power controller electrically connected between the high-frequency power supply and the upper electrode and configured to control power supplied from the high-frequency power supply to the upper electrode. The circuit portion may be electrically connected between a line electrically connecting the high-frequency power supply and the power controller and the lower electrode. The power controller may be configured to measure the power supplied from the high-frequency power supply to the upper electrode and control the high-frequency power supply to increase or decrease the power output by the high-frequency power supply according to a result of the measurement.

Hereinafter, various exemplary embodiments will be described in detail with reference to the drawings. Further, in each drawing, the same or corresponding parts are denoted by the same reference numerals. FIG. 1 is a diagram schematically illustrating a plasma processing apparatus according to one exemplary embodiment. A plasma processing apparatus 1 shown in FIG. 1 includes a chamber 10. The chamber 10 provides an internal space therein. The chamber 10 may include a chamber body 12. The chamber body 12 has a substantially cylindrical shape. The internal space of the chamber 10 is provided within the chamber body 12. The chamber body 12 is made of metal such as aluminum. The chamber body 12 is electrically grounded. Further, a sidewall of the chamber body 12 may provide a passage through which a substrate W is transferred. Further, a gate valve may be provided along the sidewall of the chamber body 12 to open and close this passage.

The plasma processing apparatus 1 further includes a substrate support 14. The substrate support 14 is installed inside the chamber 10. The substrate support 14 is configured to support the substrate W mounted thereon. The substrate support 14 has a main body. The main body of the substrate support 14 may be made of, for example, aluminum nitride, and have a disc shape. The substrate support 14 may be supported by a support member 16. The support member 16 extends upwardly from a bottom of the chamber 10. The substrate support 14 includes a lower electrode 18. The lower electrode 18 is included in the substrate support 14 and is embedded in the main body of the substrate support 14.

The plasma processing apparatus 1 further includes an upper electrode 20. The upper electrode 20 is provided inside the chamber 10 and above the substrate support 14. The upper electrode 20 is disposed to face the lower electrode 18. The upper electrode 20 constitutes a ceiling of the chamber 10. The upper electrode 20 is electrically separated from the chamber body 12. In one embodiment, the upper electrode 20 is fixed to an upper portion of the chamber body 12 via an insulating member 21.

In one embodiment, the upper electrode 20 is configured as a shower head. The upper electrode 20 provides a gas diffusion space 20$d$ therein. Further, the upper electrode 20 further provides a plurality of gas holes 20$h$. The plurality of gas holes 20$h$ extend downwardly from the gas diffusion space 20$d$ and open toward the internal space of the chamber 10. That is, the plurality of gas holes 20$h$ connect the gas diffusion space 20$d$ and the internal space of the chamber 10.

The plasma processing apparatus 1 further includes a gas supply 22. The gas supply 22 is configured to supply a gas into the chamber 10. The gas supply 22 is configured to supply a processing gas between the upper electrode 20 and the lower electrode 18. The gas supply 22 is connected to the gas diffusion space 20$d$ via a pipe 23. The gas supply 22 may include one or more gas sources, one or more flow controllers, and one or more on-off valves. Each of the one or more gas sources is connected to the pipe 23 via a corresponding flow controller and a corresponding on-off valve.

In one embodiment, the gas supply 22 may supply a film forming gas. That is, the plasma processing apparatus 1 may be a film forming apparatus. A film formed on the substrate W using the film forming gas may be an insulating film. In another embodiment, the gas supply 22 may supply an etching gas. That is, the plasma processing apparatus 1 may be a plasma etching apparatus.

The plasma processing apparatus 1 further includes an exhaust device 24. The exhaust device 24 includes a pressure controller such as an automatic pressure control valve, and a vacuum pump such as a turbomolecular pump or a dry pump. The exhaust device 24 is connected to the internal space of the chamber 10 through an exhaust pipe from an exhaust port 12$e$ provided on the sidewall of the chamber body 12.

The plasma processing apparatus 1 further includes a high-frequency power supply 26. The high-frequency power supply 26 is electrically connected to the upper electrode 20 via a matching device 28. The high-frequency power supply 26 may be configured to include the matching device 28. The high-frequency power supply 26 is configured to apply a high-frequency voltage to the upper electrode 20 to generate a plasma of the processing gas supplied between the upper electrode 20 and the lower electrode 18 from the gas supply 22. In one embodiment, the high-frequency power supply 26 generates high-frequency power. A frequency of the high-frequency power may be any frequency. The frequency of the high-frequency power may be 13.56 MHz or lower. The frequency of the high-frequency power may be 2 MHz or lower. The frequency of the high-frequency power may be 20 kHz or higher.

The high-frequency power supply 26 is connected to the upper electrode 20 via the matching device 28. The high-frequency power from the high-frequency power supply 26 is supplied to the upper electrode 20 via the matching device 28. The matching device 28 includes a matching circuit that matches an impedance of a load of the high-frequency power supply 26 with an output impedance of the high-frequency power supply 26.

In another embodiment, the high-frequency power supply 26 may be configured to periodically apply a pulse of a direct current (DC) voltage to the upper electrode 20. A frequency that defines a cycle of applying the pulse of the DC voltage from the high-frequency power supply 26 to the upper electrode 20 is, for example, 10 kHz or higher and 10 MHz or lower. Further, when the high-frequency power supply 26 is configured to periodically apply the pulse of the DC voltage to the upper electrode 20, the plasma processing apparatus 1 may not include the matching device 28.

The plasma processing apparatus 1 further includes a ring electrode 30. The ring electrode 30 has an annular shape. The ring electrode 30 may be divided into a plurality of electrodes arranged along a circumferential direction. The ring electrode 30 is provided around the substrate support 14 so as to surround an outer periphery of the substrate support 14. A gap is provided between the ring electrode 30 and the outer periphery of the substrate support 14, but the gap may not be provided. The ring electrode 30 is electrically grounded.

In one embodiment, the plasma processing apparatus 1 further includes a gas supply 32. The gas supply 32 supplies a purge gas so that the purge gas flows upwardly through the gap between the ring electrode 30 and the substrate support 14. The gas supply 32 supplies the purge gas into the chamber 10 through a gas introduction port 12p. In the illustrated example, the gas introduction port 12p is provided on a wall of the chamber body 12 under the substrate support 14. The purge gas supplied by the gas supply 32 may be an inert gas and may be, for example, a rare gas.

When plasma processing is performed on the substrate W in the plasma processing apparatus 1, the processing gas is supplied into the chamber 10 from the gas supply 22. The high-frequency power or the pulse of the DC voltage from the high-frequency power supply 26 is applied to the upper electrode 20. As a result, a plasma is generated from the processing gas within the chamber 10. The substrate W on the substrate support 14 is processed with chemical species from the generated plasma. For example, the chemical species from the plasma forms a film on the substrate W. Alternatively, the chemical species from the plasma etches the substrate W.

In one embodiment, the plasma processing apparatus 1 further includes a circuit portion 4. The circuit portion 4 is electrically connected between the high-frequency power supply 26 and the lower electrode 18. The circuit portion 4 is configured to provide a potential to the lower electrode 18. More specifically, the circuit portion 4 is configured to provide a potential to the lower electrode 18 by causing a current to flow from the high-frequency power supply 26 toward the lower electrode 18 when a potential of the high-frequency power supply 26 is higher than a potential of the lower electrode 18.

Figure 2:
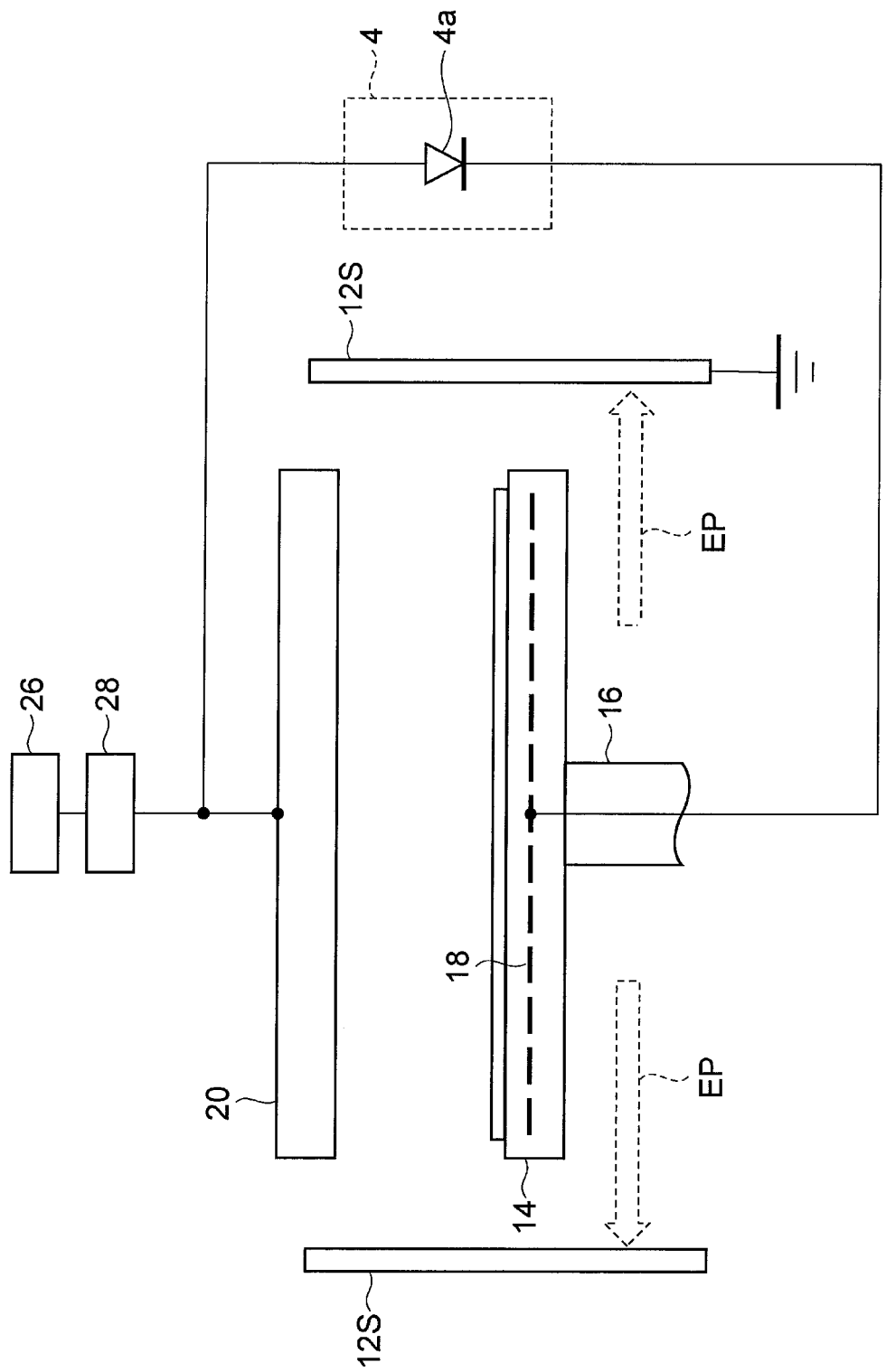
FIG. 2 is a diagram illustrating an exemplary circuit portion.

In one embodiment, as shown in FIG. 2, the circuit portion 4 may include a diode 4a. An anode of the diode 4a is electrically connected to the high-frequency power supply 26 via the matching device 28. A cathode of the diode 4a is electrically connected to the lower electrode 18.

According to the plasma processing apparatus 1 including the circuit portion 4, the circuit portion 4 makes the potential of the lower electrode 18 equal to or higher than the potential of the high-frequency power supply 26 that provides the potential to the upper electrode 20. Accordingly, a sheath voltage in a sheath region formed at a boundary between the substrate W mounted on the lower electrode 18 and the plasma during plasma generation becomes low. Therefore, energy of ions in the plasma which may collide with the substrate W is reduced.

Figure 7:
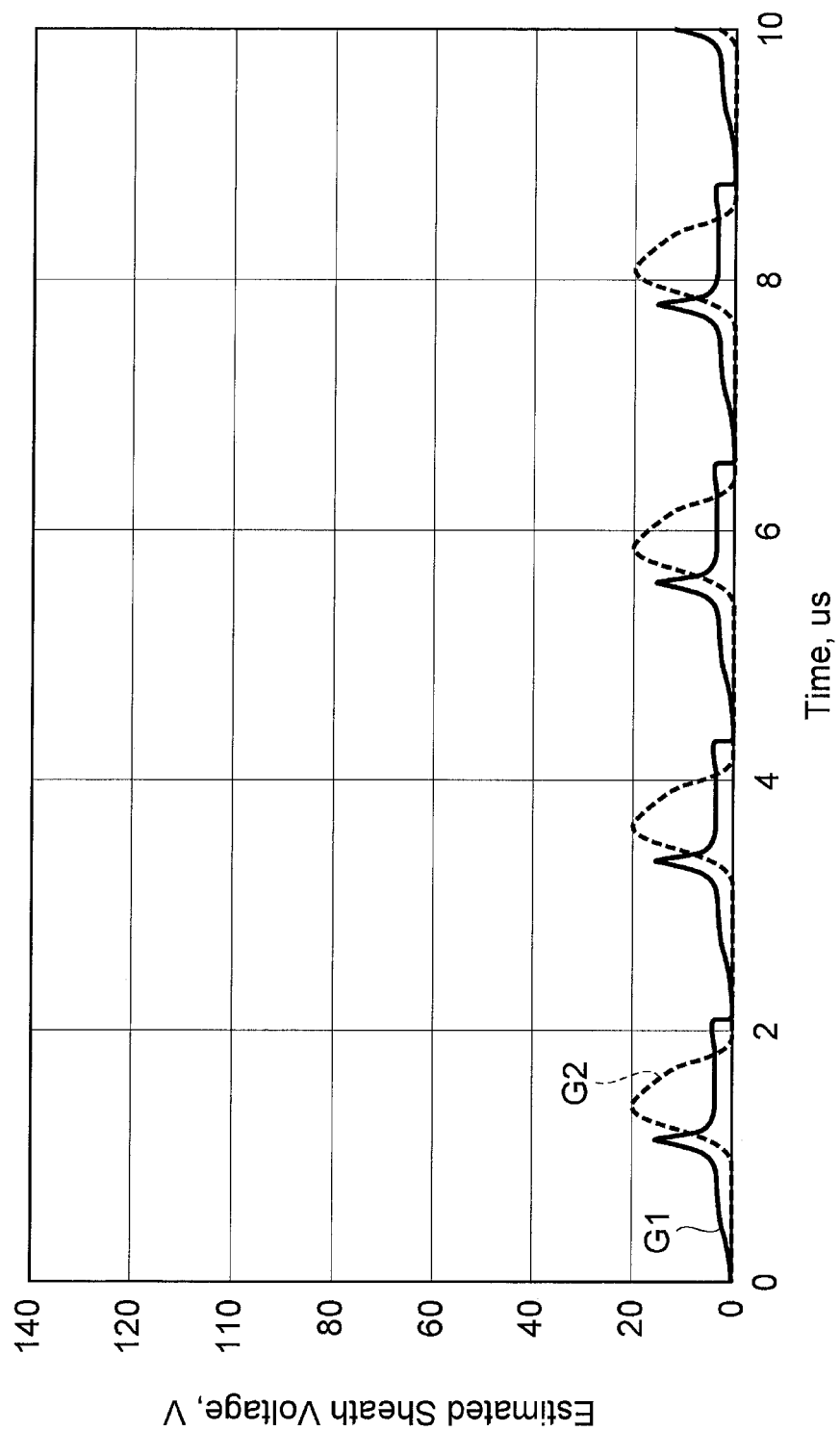
FIG. 7 is a diagram illustrating a simulation result by a plasma processing apparatus according to one exemplary embodiment.
Figure 8:
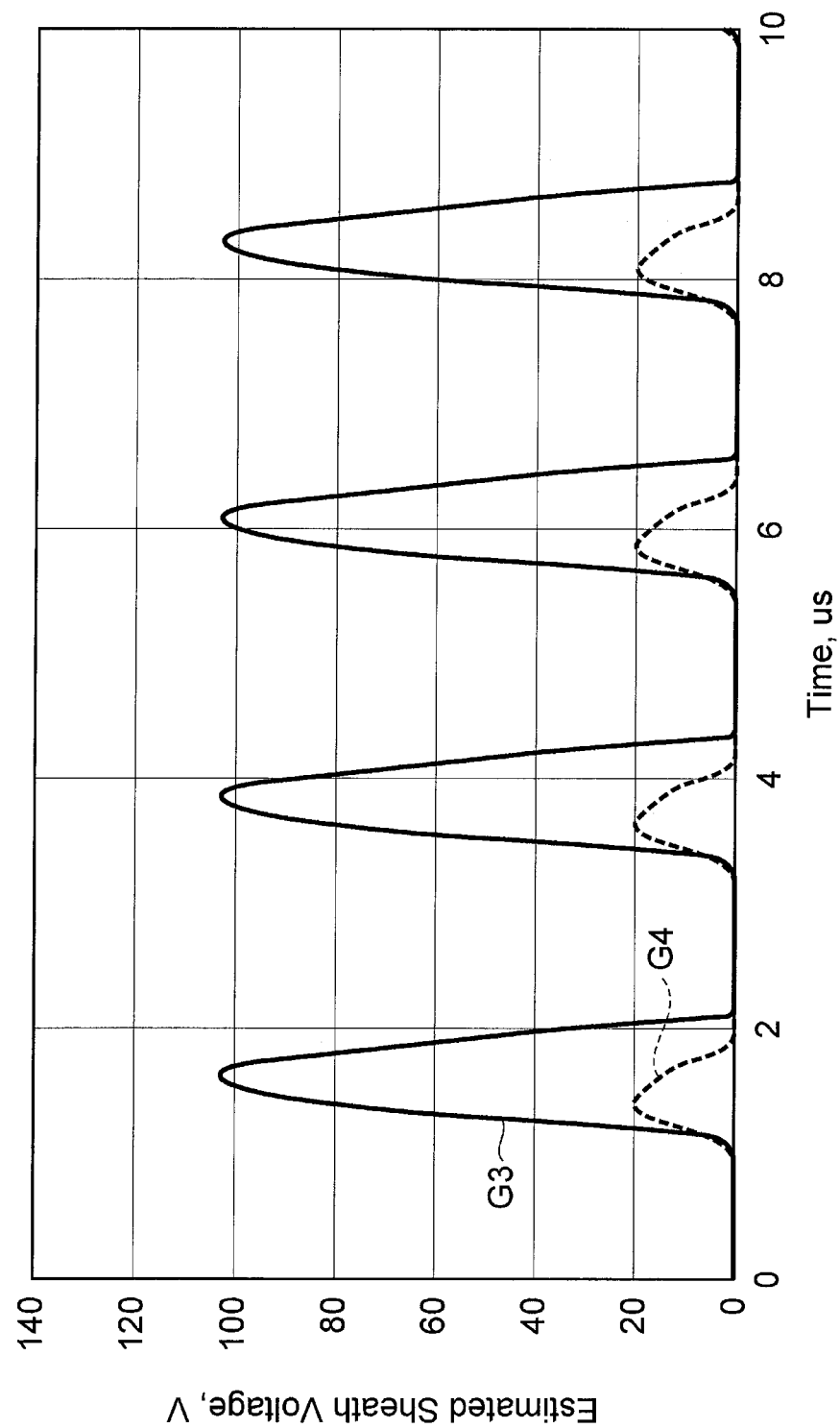
FIG. 8 is a diagram illustrating a simulation result by a conventional plasma processing apparatus.

Further, when plasma is formed in a space between an electrically grounded sidewall 12S of the chamber body 12 and the lower electrode 18, power may flow from the lower electrode 18 to the ground through the sidewall 12S along a power flow path EP. Reference is made here to FIG. 8. In the plasma processing apparatus 1 that does not include the circuit portion 4, a sheath voltage (a waveform G3) that may be generated when power flows from the lower electrode 18 to the ground through the sidewall 12S is higher than a sheath voltage (a waveform G4) that may be generated when no power flows from the lower electrode 18 to the ground through the sidewall 12S. On the other hand, in the plasma processing apparatus 1 including the circuit portion 4, the potential of the lower electrode 18 is equal to or higher than the potential of the high-frequency power supply 26 that provides the potential to the upper electrode 20. Accordingly, as shown in FIG. 7, the sheath voltage (a waveform G1) that may be generated when power flows from the lower electrode 18 to the ground through the sidewall 12S is approximately the same as the sheath voltage (a waveform G2) that may be generated when no power flows from the lower electrode 18 to the ground through the sidewall 12S. Thus, even when power flows from the lower electrode 18 to the ground through the sidewall 12S, it is possible to avoid an increase in the sheath voltage.

The above effects of the plasma processing apparatus 1 including the circuit portion 4 are similarly obtained not only in the plasma processing apparatus 1 including the circuit portion 4 shown in FIG. 2, but also in the plasma processing apparatuses 1 including the circuit portion 4 shown in each of FIGS. 3 to 6 to be described below.

Figure 3:
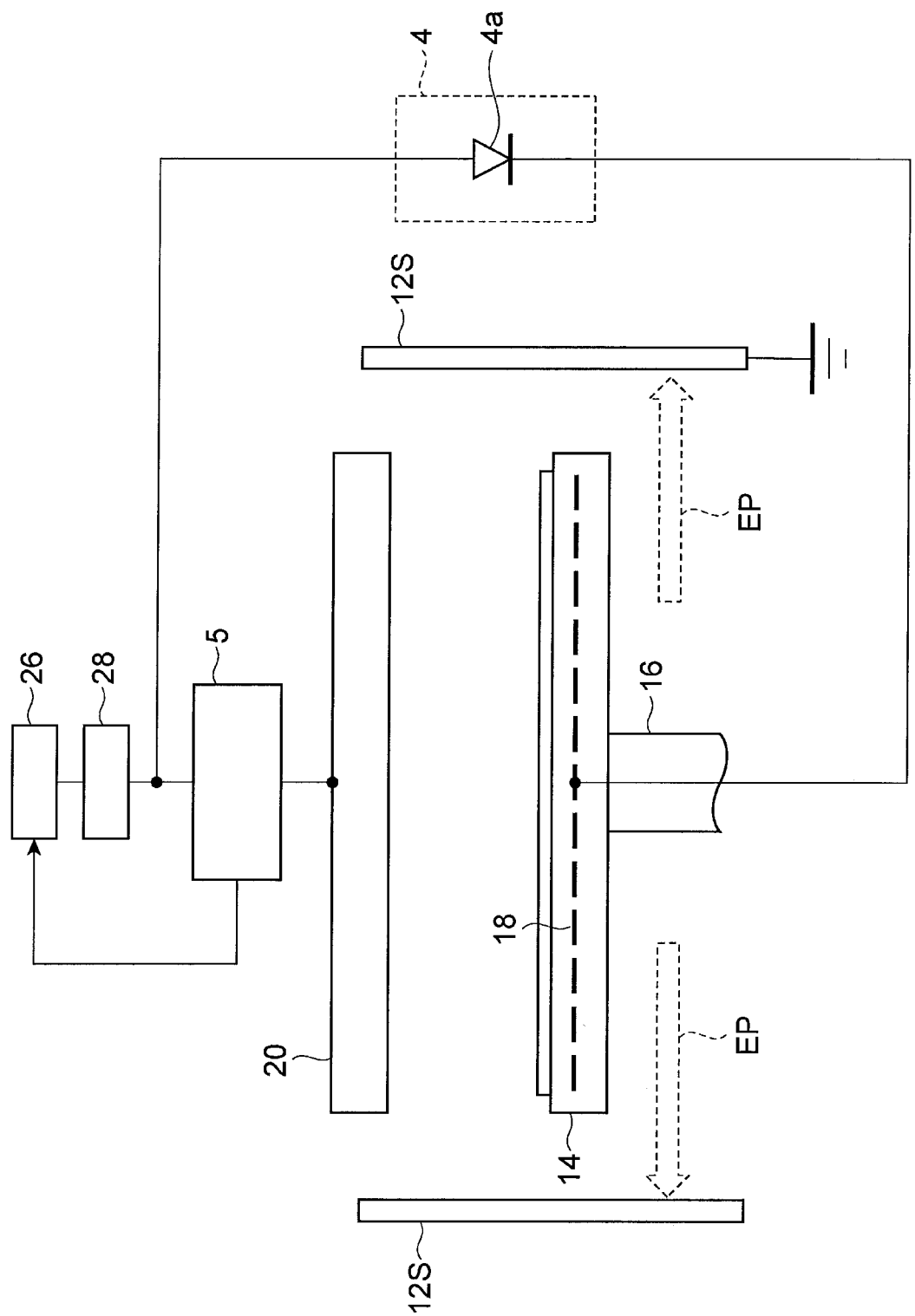
FIG. 3 is a diagram illustrating a configuration of a plasma processing apparatus including an exemplary power controller.

In one embodiment, as shown in FIG. 3, the plasma processing apparatus 1 may include a power controller 5. The power controller 5 is electrically connected between the high-frequency power supply 26 and the upper electrode 20. The power controller 5 is electrically connected to the high-frequency power supply 26 via the matching device 28. The circuit portion 4 is electrically connected between a line electrically connecting the high-frequency power supply 26 and the power controller 5 and the lower electrode 18. The line is electrically connected to the high-frequency power supply 26 via the matching device 28. The power controller 5 is configured to control the power supplied from the high-frequency power supply 26 to the upper electrode 20. More specifically, the power controller 5 is configured to measure the power supplied from the high-frequency power supply 26 to the upper electrode 20, and control the high-frequency power supply 26 to increase or decrease the power output by the high-frequency power supply 26 according to a result of the measurement.

The power controller 5 can suitably control the power supplied from the high-frequency power supply 26 to the upper electrode 20. For example, power may flow to the ground through the sidewall 12S along the power flow path EP in a space under the lower electrode 18, and the power from the high-frequency power supply 26 to the upper electrode 20 may be reduced. Even in this case, the power controller 5 can compensate for this reduction in power by causing the high-frequency power supply 26 to increase the output power.

Figure 4:
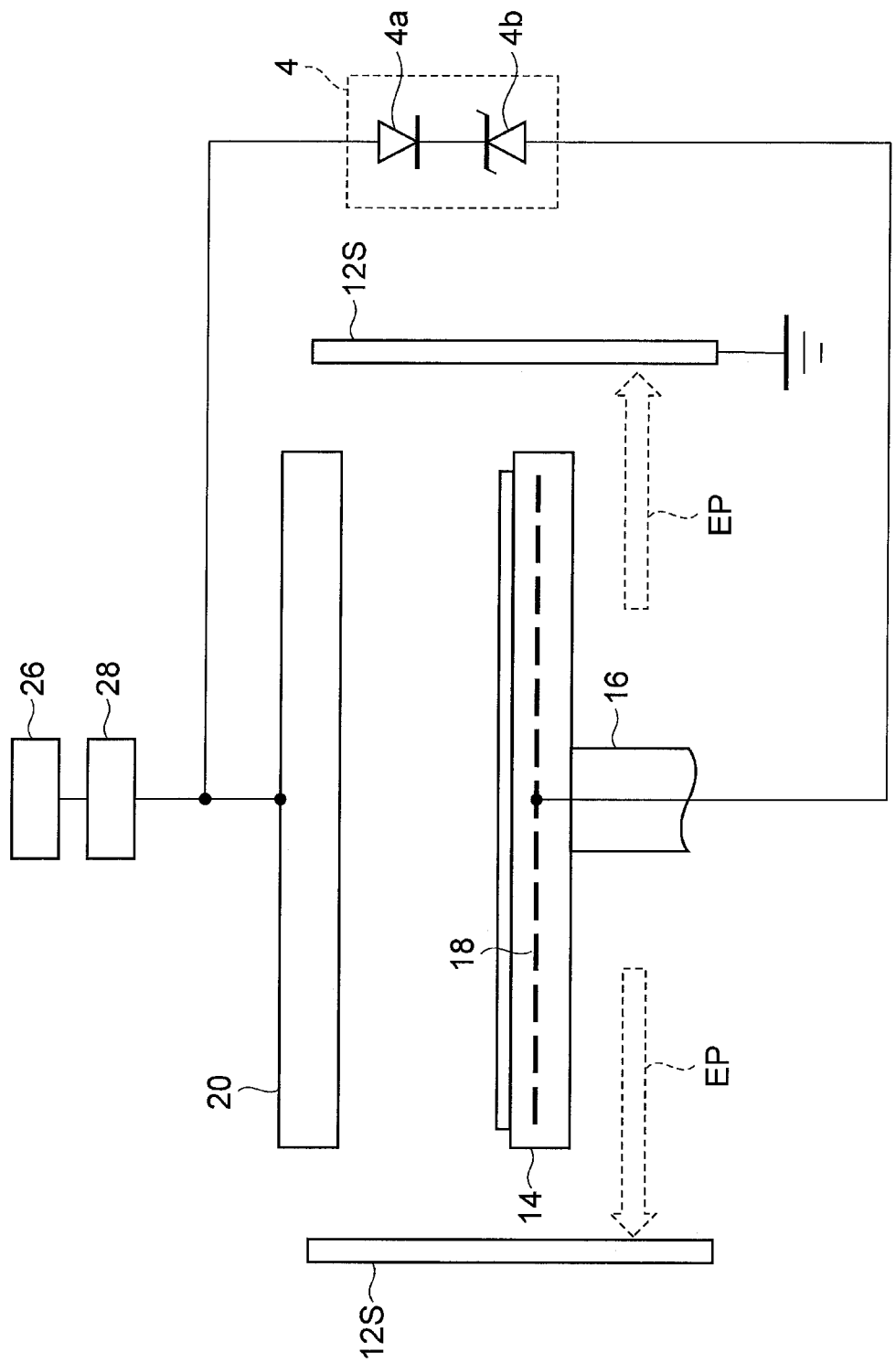
FIG. 4 is a diagram illustrating an exemplary circuit portion.

In one embodiment, as shown in FIG. 4, the circuit portion 4 may include the diode 4a and a Zener diode 4b. The diode 4a and the Zener diode 4b may be connected in series. The anode of the diode 4a is electrically connected to the high-frequency power supply 26 via the matching device 28. The cathode of the diode 4a is electrically connected to a cathode of the Zener diode 4b. An anode of the Zener diode 4b is electrically connected to the lower electrode 18. Further, the plasma processing apparatus 1 including the circuit portion 4 shown in FIG. 4 may further include the power controller 5 shown in FIG. 3.

Figure 9:
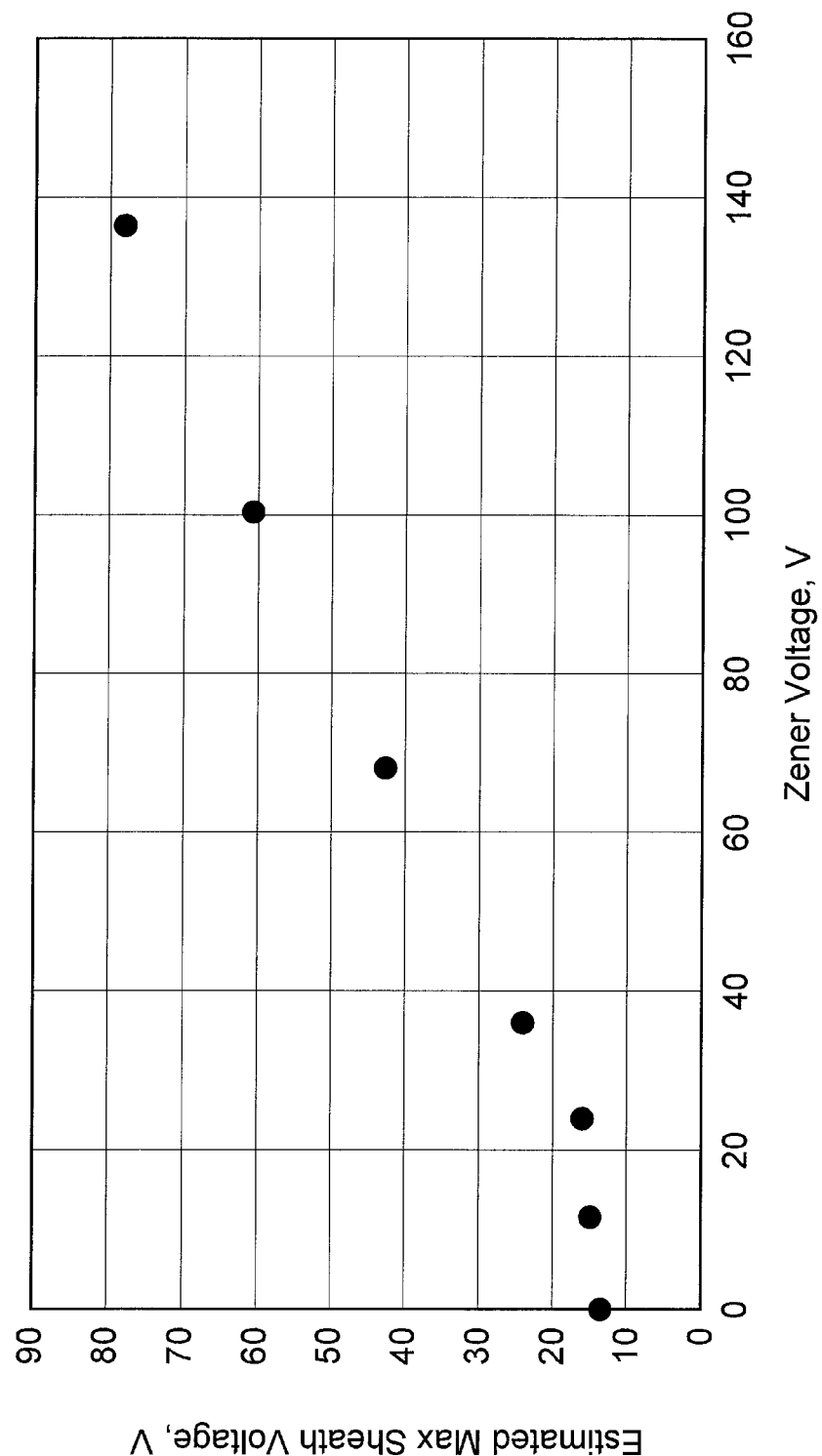
FIG. 9 is a diagram illustrating a simulation result by a plasma processing apparatus according to one exemplary embodiment.

The Zener diode 4b of the circuit portion 4 provides a potential difference between the high-frequency power supply 26 and the lower electrode 18. As shown in a graph of FIG. 9, by increasing or decreasing this potential difference (a horizontal axis of the graph of FIG. 9), the sheath potential (a vertical axis of the graph of FIG. 9) in the sheath region formed at the boundary between the substrate W on the lower electrode 18 and the plasma is increased or decreased. Thus, according to the circuit portion 4 including the Zener diode 4b, it is possible to control the sheath potential to a suitable value. Such an effect by the circuit portion 4 including the Zener diode 4b is similarly obtained by the circuit portion 4 including a resistor 4c and an inductor shown in FIG. 5, which will be described below.

Figure 5:
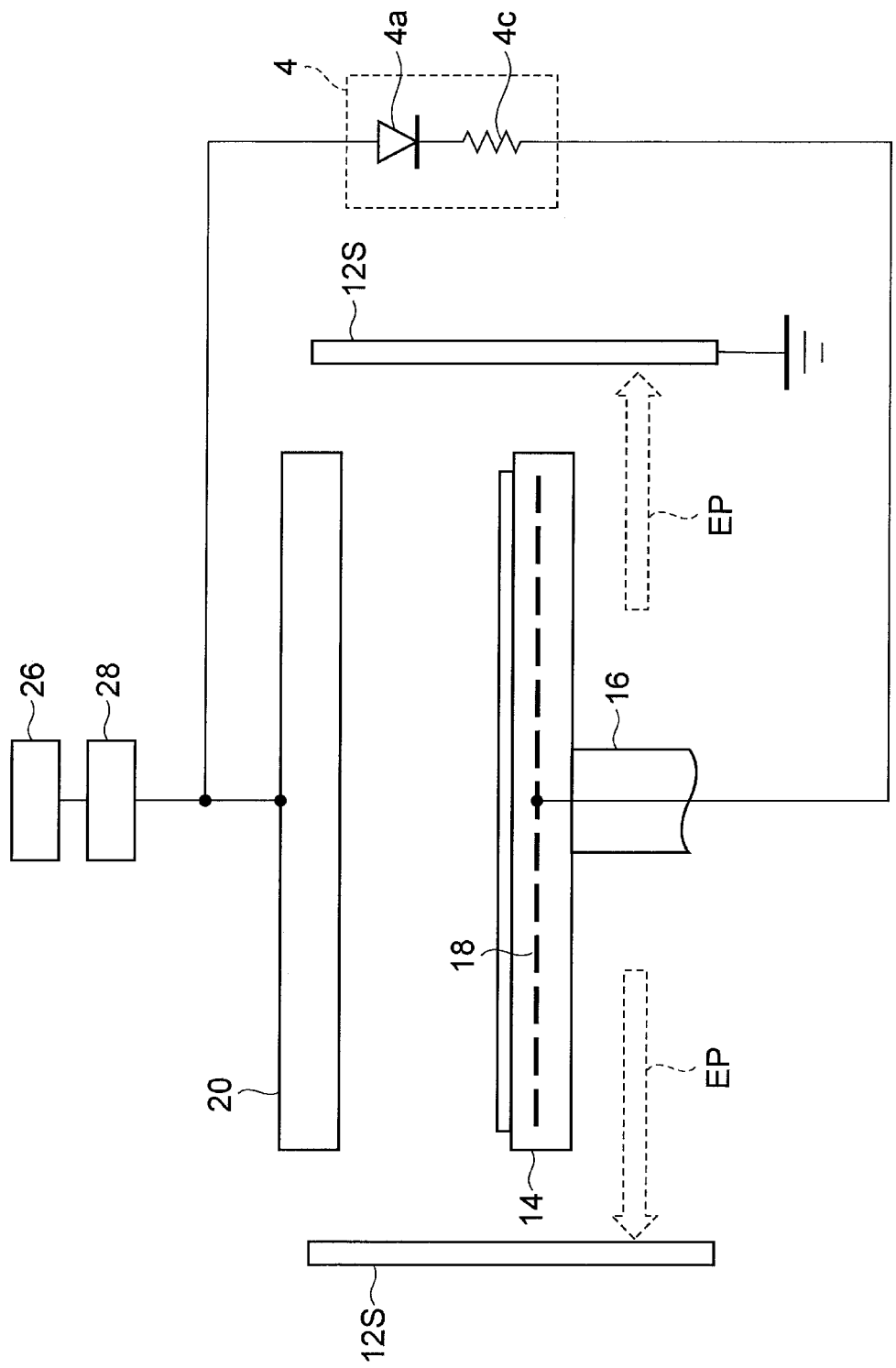
FIG. 5 is a diagram illustrating an exemplary circuit portion.

In one embodiment, as shown in FIG. 5, the circuit portion 4 may include the diode 4a and the resistor 4c. The diode 4a and the resistor 4c may be connected in series. The anode of the diode 4a may be electrically connected to the high-frequency power supply 26 via the matching device 28. The cathode of the diode 4a may be electrically connected to the lower electrode 18 via the resistor 4c. Further, the plasma processing apparatus 1 including the circuit portion 4 shown in FIG. 5 may further include the power controller 5 shown in FIG. 3. The resistor 4c may be a variable resistor, and a resistance value of the resistor 4c, which is a variable resistor, can be suitably controlled by a control device (not shown) that controls the operation of the plasma processing apparatus 1, for example.

In one embodiment, the circuit portion 4 shown in FIG. 5 may include an inductor instead of the resistor 4c. This inductor may be connected in series with the diode 4a. The anode of the diode 4a may be electrically connected to the high-frequency power supply 26 via the matching device 28. The cathode of the diode 4a may be electrically connected to the lower electrode 18 via the inductor. Further, the plasma processing apparatus 1 in which the circuit portion 4 shown in FIG. 5 includes the inductor instead of the resistor 4c may further include the power controller 5 shown in FIG. 3. This inductor may be a variable inductor, and an inductance of the variable inductor can be suitably controlled by a control device (not shown) that controls the operation of the plasma processing apparatus 1, for example.

Figure 6:
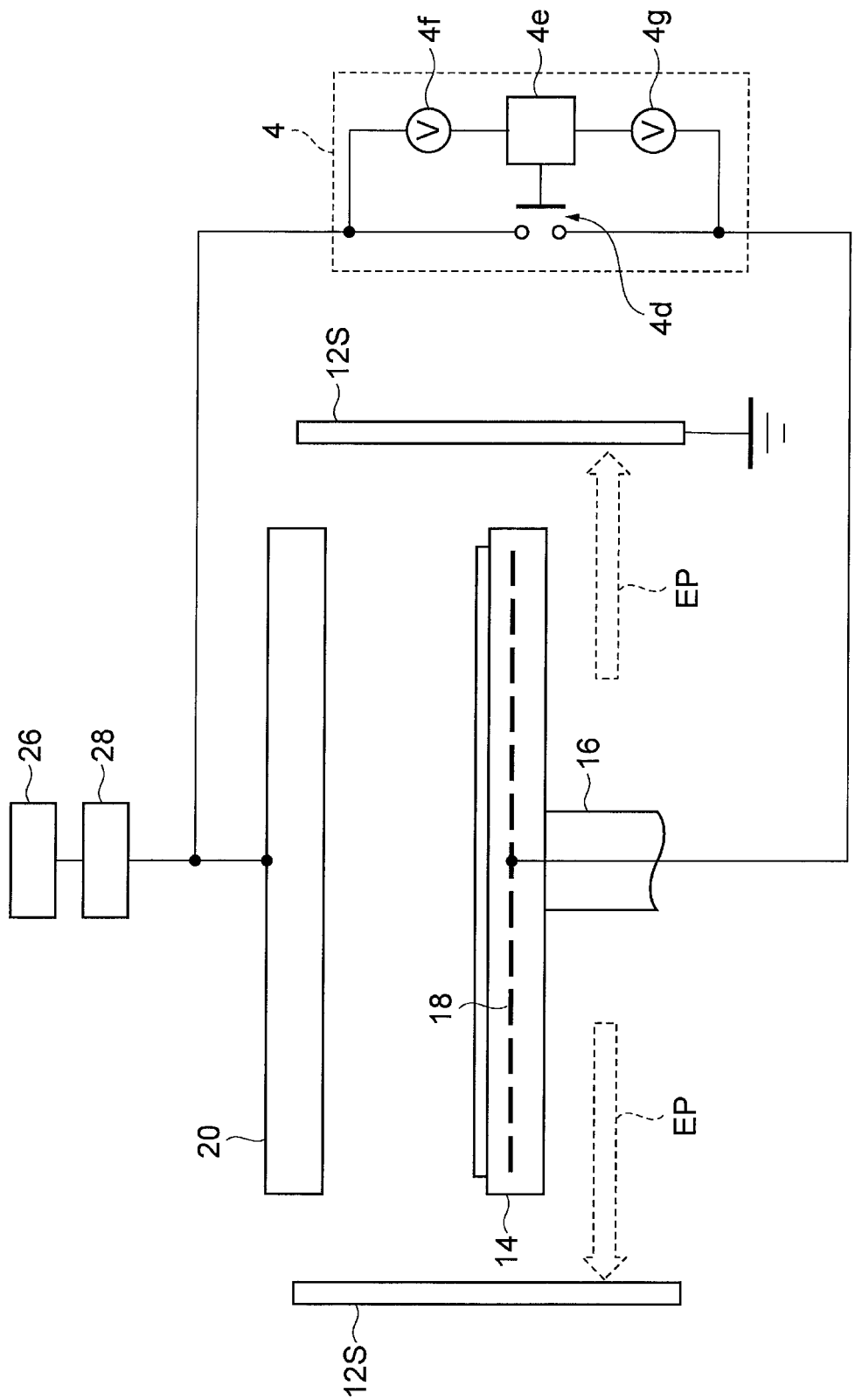
FIG. 6 is a diagram illustrating an exemplary circuit portion.

In one embodiment, as shown in FIG. 6, the circuit portion 4 may include a potential measuring device 4f, a potential measuring device 4g, a switching element 4d, and a driving circuit 4e. The switching element 4d may be electrically connected between the high-frequency power supply 26 and the lower electrode 18. The switching element 4d may be electrically connected to the high-frequency power supply 26 via the matching device 28. The switching element 4d may be configured to turn on and off electrical continuity between the high-frequency power supply 26 and the lower electrode 18.

The potential measuring device 4f may be electrically connected between the high-frequency power supply 26 and the driving circuit 4e. The potential measuring device 4f may be electrically connected to the high-frequency power supply 26 via the matching device 28. The potential measuring device 4f may measure a potential of the high-frequency power supply 26 to generate a first measurement result, and output this first measurement result to the driving circuit 4e. The potential measuring device 4g may be electrically connected between the lower electrode 18 and the driving circuit 4e. The potential measuring device 4g may measure a potential of the lower electrode 18 to generate a second measurement result, and output this second measurement result to the driving circuit 4e.

The driving circuit 4e may be configured to drive the switching element 4d to turn on the electrical continuity between the high-frequency power supply 26 and the lower electrode 18 when the potential of the high-frequency power supply 26 is higher than the potential of the lower electrode 18 on the basis of the first measurement result and the second measurement result. The driving circuit 4e may be configured to drive the switching element 4d to turn off the electrical continuity between the high-frequency power supply 26 and the lower electrode 18 when the potential of the high-frequency power supply 26 is equal to or lower than the potential of the lower electrode 18 on the basis of the first measurement result and the second measurement result.

The plasma processing apparatus 1 including the circuit portion 4 shown in FIG. 6 may further include the power controller 5 shown in FIG. 3.

While various exemplary embodiments have been described above, various additions, omissions, substitutions, and modifications may be made without being limited to the exemplary embodiments described above. Further, elements from different embodiments can be combined to form other embodiments.

From the above description, it will be appreciated that various embodiments of the present disclosure have been described herein for purposes of description, and that various modifications may be made without departing from the scope and spirit of the disclosure. Therefore, the various embodiments disclosed in the present disclosure are not intended to be limited.

What is claimed is:

1. A plasma processing apparatus comprising:
   a chamber;
   a lower electrode provided in the chamber and included in a substrate support configured to mount a substrate thereon;
   an upper electrode provided in the chamber and disposed to face the lower electrode;
   a gas supply configured to supply a processing gas between the upper electrode and the lower electrode;

a high-frequency power supply including an output that is electrically connected to the upper electrode, the high-frequency power supply configured to generate a plasma of the processing gas by applying a high-frequency voltage to the upper electrode via the output of the high-frequency power supply; and a circuit portion including an input that is electrically connected to the output of the high-frequency power supply and an output that is electrically connected to the lower electrode, the circuit portion configured to provide a potential to the lower electrode, wherein the circuit portion is configured to provide the potential to the lower electrode by causing a current to flow from the high-frequency power supply to the input of the circuit portion rather than to the upper electrode and to supply the lower electrode via the output of the circuit portion when a potential of the high-frequency power supply supplied to the upper electrode is higher than a potential of the lower electrode.

2. The plasma processing apparatus of claim 1, wherein the circuit portion includes a diode, an anode of the diode is in input of the circuit portion and is electrically connected to the output of the high-frequency power supply, and a cathode of the diode is the output of the circuit portion and is electrically connected to the lower electrode.

3. The plasma processing apparatus of claim 2, further comprising:

a power controller electrically connected to the output of the high-frequency power supply and the upper electrode and configured to control power supplied from the high-frequency power supply to the upper electrode, wherein the input of the circuit portion is electrically connected to a line that electrically connects the output of the high-frequency power supply and the power controller and the lower electrode, and the power controller is configured to measure the power supplied from the high-frequency power supply to the upper electrode and control the high-frequency power supply to increase or decrease the power output by the high-frequency power supply according to a result of the measurement.

4. The plasma processing apparatus of claim 1, wherein the circuit portion includes a diode and a Zener diode, the diode and the Zener diode are connected in series, an anode of the diode is the input of the circuit portion and is electrically connected to the output of the high-frequency power supply, a cathode of the diode is electrically connected to a cathode of the Zener diode, and an anode of the Zener diode is the output of the circuit portion and is electrically connected to the lower electrode.

5. The plasma processing apparatus of claim 4, further comprising:

a power controller electrically connected to the output of the high-frequency power supply and the upper electrode and configured to control power supplied from the high-frequency power supply to the upper electrode, wherein the input of the circuit portion is electrically connected to a line that electrically connects the output of the high-frequency power supply and the power controller and the lower electrode, and the power controller is configured to measure the power supplied from the high-frequency power supply to the upper electrode and control the high-frequency power supply to increase or decrease the power output by the high-frequency power supply according to a result of the measurement.

6. The plasma processing apparatus of claim 1, wherein the circuit portion includes a diode and a resistor, the resistor having a first end and a second end, the diode and the resistor are connected in series, an anode of the diode is the input of the circuit portion and is electrically connected to the output of the high-frequency power supply, and a cathode of the diode is electrically connected to the first end of the resistor and the second end of the resistor is the output of the circuit portion and is connected to the lower electrode.

7. The plasma processing apparatus of claim 6, further comprising:

a power controller electrically connected to the output of the high-frequency power supply and the upper electrode and configured to control power supplied from the high-frequency power supply to the upper electrode, wherein the input of the circuit portion is electrically connected to a line that electrically connects the output of the high-frequency power supply and the power controller and the lower electrode, and the power controller is configured to measure the power supplied from the high-frequency power supply to the upper electrode and control the high-frequency power supply to increase or decrease the power output by the high-frequency power supply according to a result of the measurement.

8. The plasma processing apparatus of claim 1, wherein the circuit portion includes a diode and an inductor, the inductor having a first end and a second end, the diode and the inductor are connected in series, an anode of the diode is the input of the circuit portion and is electrically connected to the output of the high-frequency power supply, and a cathode of the diode is electrically connected to the first end of the inductor and the second end of the inductor is the output of the circuit portion and is connected to the lower electrode.

9. The plasma processing apparatus of claim 8, further comprising:

a power controller electrically connected to the output of the high-frequency power supply and the upper electrode and configured to control power supplied from the high-frequency power supply to the upper electrode, wherein the input of the circuit portion is electrically connected to a line that electrically connects the output of the high-frequency power supply and the power controller and the lower electrode, and the power controller is configured to measure the power supplied from the high-frequency power supply to the upper electrode and control the high-frequency power supply to increase or decrease the power output by the high-frequency power supply according to a result of the measurement.

10. The plasma processing apparatus of claim 1, wherein the circuit portion includes a first potential measuring device, a second potential measuring device, a switching element, and a driving circuit, the switching element is electrically connected between the high-frequency power supply and the lower electrode and configured to turn on and off electrical continuity between the high-frequency power supply and the lower electrode, the first potential measuring device is connected to the input of the circuit portion and is electrically connected to the output of the high-frequency power supply and the driving circuit, measures a potential of the high-frequency power supply to generate a first measurement result, and outputs the first measurement result to the driving circuit, the second potential measuring device is electrically connected to the output of the circuit portion, the lower electrode and the driving circuit, measures a potential of the lower electrode to generate a second measurement result, and outputs the second measurement result to the driving circuit, and the driving circuit is configured to drive the switching element to turn on the electrical continuity between the high-frequency power supply and the lower electrode when the potential of the high-frequency power supply is higher than the potential of the lower electrode and drive the switching element to turn off the electrical continuity between the high-frequency power supply and the lower electrode when the potential of the high-frequency power supply is equal to or lower than the potential of the lower electrode, on the basis of the first measurement result and the second measurement result.

11. The plasma processing apparatus of claim 10, further comprising:

a power controller electrically connected to the output of the high-frequency power supply and the upper electrode and configured to control power supplied from the high-frequency power supply to the upper electrode, wherein the input of the circuit portion is electrically connected to a line that electrically connects the output of the high-frequency power supply and the power controller and the lower electrode, and the power controller is configured to measure the power supplied from the high-frequency power supply to the upper electrode and control the high-frequency power supply to increase or decrease the power output by the high-frequency power supply according to a result of the measurement.

12. The plasma processing apparatus of claim 1, further comprising:

a power controller electrically connected to the output of the high-frequency power supply and the upper electrode and configured to control power supplied from the high-frequency power supply to the upper electrode, wherein the input of the circuit portion is electrically connected to a line that electrically connects the output of the high-frequency power supply and the power controller and the lower electrode, and the power controller is configured to measure the power supplied from the high-frequency power supply to the upper electrode and control the high-frequency power supply to increase or decrease the power output by the high-frequency power supply according to a result of the measurement.

\* \* \* \* \*